United States Patent
Yoon et al.

(10) Patent No.: US 9,231,224 B2
(45) Date of Patent: Jan. 5, 2016

(54) ORGANIC LIGHT EMITTING DIODE DISPLAY

(71) Applicant: SAMSUNG DISPLAY CO., LTD., Yongin, Gyeonggi-Do (KR)

(72) Inventors: Seok-Gyu Yoon, Yongin (KR); Kyu-Hwan Hwang, Yongin (KR); Eung-Do Kim, Yongin (KR); Dong-Chan Kim, Yongin (KR); Dong-Kyu Seo, Yongin (KR); Bo-Ra Jung, Yongin (KR); Won-Jong Kim, Yongin (KR); Young-Woo Song, Yongin (KR); Jong-Hyuk Lee, Yongin (KR); Da-Hea Im, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/283,623

(22) Filed: May 21, 2014

(65) Prior Publication Data
US 2015/0048325 A1   Feb. 19, 2015

(30) Foreign Application Priority Data

Aug. 14, 2013   (KR) .................. 10-2013-0096834

(51) Int. Cl.
*H01L 51/50*   (2006.01)
*H01L 27/32*   (2006.01)
*H01L 51/52*   (2006.01)

(52) U.S. Cl.
CPC .......... *H01L 51/506* (2013.01); *H01L 27/3211* (2013.01); *H01L 51/5265* (2013.01)

(58) Field of Classification Search
CPC .. H01L 27/3211; H01L 27/322; H01L 27/326
USPC ...................................... 257/40, 88
See application file for complete search history.

(56) References Cited

U.S. PATENT DOCUMENTS

| | | | |
|---|---|---|---|
| 2008/0284324 A1* | 11/2008 | Chun et al. ............... | 313/504 |
| 2013/0001526 A1* | 1/2013 | Kwak et al. .............. | 257/40 |
| 2013/0001532 A1* | 1/2013 | Hwang et al. ............. | 257/40 |
| 2013/0140533 A1* | 6/2013 | Lee et al. ................. | 257/40 |
| 2014/0191202 A1* | 7/2014 | Shim et al. ............... | 257/40 |

FOREIGN PATENT DOCUMENTS

| | | |
|---|---|---|
| KR | 10-2012-0130516 A | 12/2012 |
| KR | 10-2013-0007408 A | 1/2013 |
| WO | WO 2006/132226 A1 | 12/2006 |

\* cited by examiner

*Primary Examiner* — John C Ingham
(74) *Attorney, Agent, or Firm* — Lee & Morse, P.C.

(57) ABSTRACT

An organic light emitting diode (OLED) display is provided. An OLED display in accordance with an exemplary embodiment may include a substrate including a first subpixel, a second subpixel, and a third subpixel, a first electrode disposed on each of the first subpixel, the second subpixel, and the third subpixel, a second electrode facing the first electrode, a first common layer disposed on the first subpixel and the second subpixel, a first emission layer and a second emission layer disposed on the first common layer, a second common layer disposed on the third subpixel, and a third emission layer disposed on the second common layer. The first common layer may include a first doping layer and a second doping layer disposed on the first doping layer. Each of the doping layers may including a p-type dopant, and the second common layer may be formed as a single layer.

10 Claims, 1 Drawing Sheet

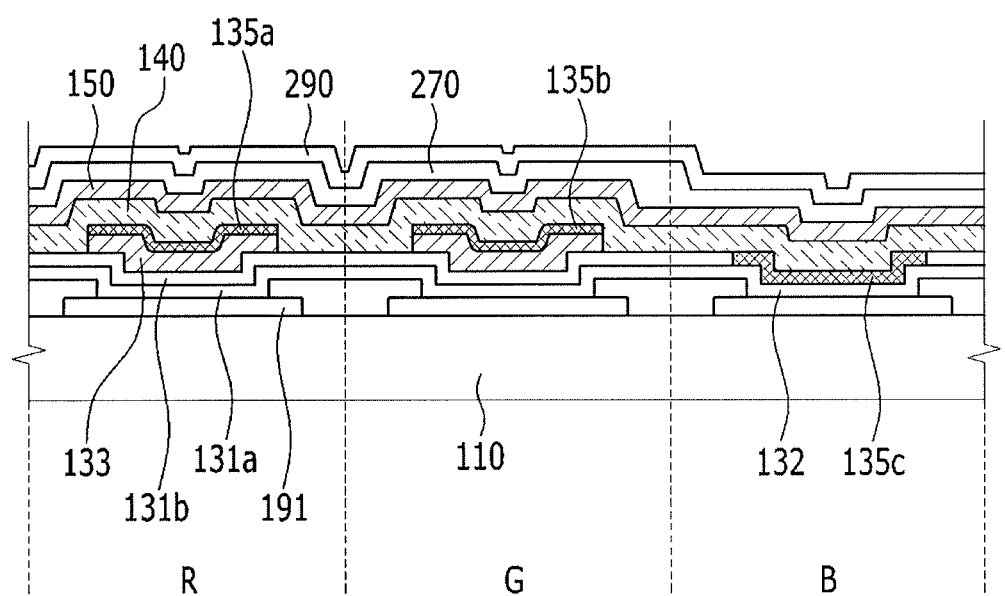

ORGANIC LIGHT EMITTING DIODE DISPLAY

CROSS-REFERENCE TO RELATED APPLICATION

Korean Patent Application No. 10-2013-0096834 filed on Aug. 14, 2013, in the Korean Intellectual Property Office, and entitled: "ORGANIC LIGHT EMITTING DIODE DISPLAY," is incorporated by reference herein in its entirety.

BACKGROUND

1. Field

Embodiments relate to an organic light emitting device.

2. Description of the Related Art

Recent trends toward lightweight and thin personal computers and televisions sets also require lightweight and thin display devices, and flat panel displays satisfying such requirements are being substituted for conventional cathode ray tubes (CRTs). However, since the LCD is a passive display device, an additional back-light as a light source is needed, and the LCD has various problems such as a slow response time and a narrow viewing angle. In this connection, an organic light emitting diode (OLED) display has recently been spotlighted as a display device that has merits such as a wide viewing angle, outstanding contrast, and a fast response time. In the organic light emitting diode device, electrons injected from one electrode and holes injected from another electrode are combined with each other in an emission layer, thereby generating excitons, and energy is outputted from the excitons to thereby emit light. The above information disclosed in this Background section is only for enhancement of understanding of the background and therefore it may include information that does not form the prior art that is already known in this country to a person of ordinary skill in the art.

SUMMARY

An organic light emitting diode (OLED) display may include a substrate including a first subpixel, a second subpixel, and a third subpixel, a first electrode on each of the first subpixel, the second subpixel, and the third subpixel. A second electrode may face the first electrode, and a first common layer may be disposed on the first subpixel and the second subpixel. A first emission layer and a second emission layer may be disposed on the first common layer, and a second common layer may be disposed on the third subpixel. A third emission layer may be disposed on the second common layer. The first common layer may include a first doping layer and a second doping layer on the first doping layer, each of the doping layers may include a p-type dopant, and the second common layer may be formed as a single layer.

The second common layer may include a p-type dopant. Each of the first common layer and the second common layer may include a hole injection material and a hole transport material.

The first emission layer may be a red emission layer, the second emission layer may be a green emission layer, and the third emission layer may be a blue emission layer.

The first electrode may include at least one of silver (Ag) and indium-tin oxide (ITO), and the second electrode may include at least one of silver (Ag), a silver alloy, aluminum (Al), an aluminum alloy, magnesium (Mg), and a magnesium alloy.

Exemplary embodiments may include a first auxiliary layer between the first common layer and the first emission layer; and a second auxiliary layer between the first common layer and the second emission layer.

The first doping layer and the second doping layer may include the same components.

BRIEF DESCRIPTION OF THE DRAWING

Features will become apparent to those of ordinary skill in the art by describing in detail exemplary embodiments with reference to the attached drawings in which:

FIG. 1 illustrates a cross-sectional view showing an organic light emitting diode (OLED) display in accordance with an exemplary embodiment.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 is a cross-sectional view showing an organic light emitting diode (OLED) display in accordance with an exemplary embodiment.

Referring to FIG. 1, the OLED display of an exemplary embodiment includes a red pixel area R, a green pixel area G, and a blue pixel area B. A first electrode 191 may be disposed on a substrate 110 in the red pixel area R, the green pixel area G, and the blue pixel area B.

The substrate 110 may be a typical substrate used in OLED displays, e.g., a glass substrate or a transparent plastic substrate, with excellent mechanical strength, thermal stability, transparency, surface smoothness, and water-resistance.

The first electrode 191 may be an anode, may be formed of silver (Ag) or a transparent conductive oxide such as indium tin oxide (ITO), indium zinc oxide (IZO), zinc oxide (ZNO), and aluminum-doped zinc oxide (AZO), and may be formed of a plurality of layers including the aforementioned materials instead of a single layer.

First common layers 131a and 131b are disposed on the first electrode 191 in the red pixel area R and the green pixel area G, and a second common layer 132 is disposed on the first electrode 191 in the blue pixel area B. Each of the first common layers 131a and 131b and the second common layer 132 may include both a hole injection material and a hole transport material to serve as a functional layer simultaneously having a hole injection function and a hole transport function. The first common layers 131a and 131b and the second common layer 132 may be formed by co-deposition of the hole injection material and the hole transport material or by allowing the hole injection material and the hole transport material to form a concentration gradient.

The first common layers 131a and 131b include a first doping layer 131a disposed at a lower side, and a second doping layer 131b disposed on the first doping layer 131a.

Each of the first doping layer 131a and the second doping layer 131b may include a p-type dopant and have a structure in which two layers are stacked. The first doping layer and the second doping layer may include the same components. Each of the first doping layer 131a and the second doping layer 131b may serve as an electrode by increasing mobility of holes so that a distance between the electrodes is shortened, thereby increasing the possibility of a short circuit between the first electrode 191 and a second electrode 270 caused by particles to be described later.

Accordingly, in an exemplary embodiment, the second common layer 132 may include the p-type dopant similar to the first common layers 131a and 131b, but may have a single-layer structure unlike the first common layers 131a and 131b. Alternatively, the second common layer 132 may include only the hole transport material and the hole injection material without including the p-type dopant. In a case of the blue pixel area B, the distance between the second common layer 132 and the second electrode 270 may be substantially increased. Accordingly, it may be possible to reduce the likelihood of a short circuit being generated between the first electrode 191 and the second electrode 270. As a result, the distance between the electrodes may be smaller, and thus the incidence of dark points caused by particles may be reduced.

A red emission layer 135a may be formed in the red pixel area R, and a green emission layer 135b may be formed in the green pixel area G. An auxiliary layer 133 may be provided between the second doping layer 131b and the red emission layer 135a and between the second doping layer 131b and the green emission layer 135b. The auxiliary layer 133 may serve to adjust an optical resonance distance for a color of each pixel area. The auxiliary layer 133 may include a well-known hole injection material or hole transport material, or a material simultaneously having a hole injection function and a hole transport function. The auxiliary layer 133 may include, e.g., a carbazole derivative such as N-phenylcarbazole, polyvinylcarbazole, N,N'-bis(3-methylphenyl)-N,N'-diphenyl-[1,1-biphenyl]-4,4'-diamine (TPD), or the like, but is not limited thereto.

In the blue pixel area B, no additional auxiliary layer may be formed between the second common layer 132 and a blue emission layer 135c.

The blue emission layer 135c may include a blue light emitting material or a mixture of a blue host and a blue dopant. The blue host may include Alq3, CBP (4,4'-N,N'-dicarbazole-biphenyl), or PVK (poly(n-vinylcarbazole)), but is not limited thereto.

The blue host material may have a hole transport characteristic. For example, a material such as ADN, which is shown below, may be employed as the blue host material.

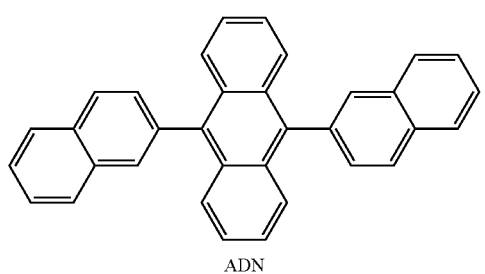 [SMILES: c1ccc2cc(-c3c4ccccc4c(-c4ccc5ccccc5c4)c4ccccc34)ccc2c1]

ADN

An example of a blue dopant may include F2Irpic, (F2ppy)2Ir(tmd), terfluorene, or the like, but is not limited thereto.

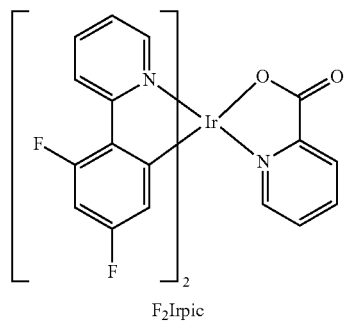

F₂Irpic

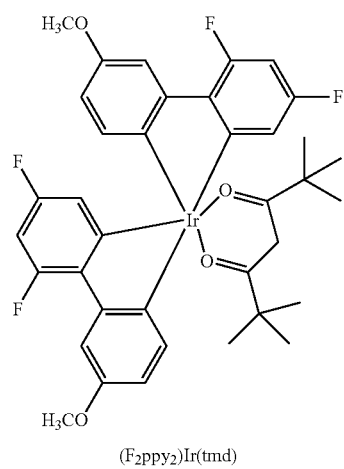

(F₂ppy₂)Ir(tmd)

The red emission layer 135a may include a red light emitting material or a mixture of a red host and a red dopant. The red host may include Alq3, CBP (4,4'-N,N'-dicarbazole-biphenyl), or PVK (poly(n-vinylcarbazole)), like the blue host. A material having an electron transport characteristic may be employed as the red host.

An example of a red dopant may include PtOEP, Ir(piq)3, Btp2Ir(acac), or the like, but is not limited thereto.

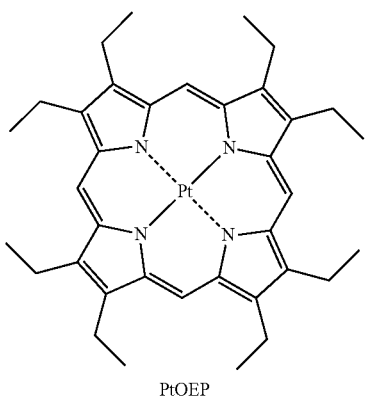

PtOEP

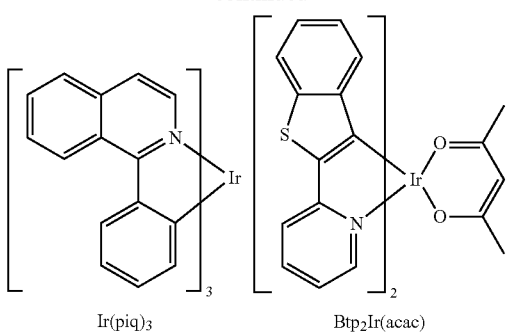

Ir(piq)₃   Btp₂Ir(acac)

The green emission layer 135b may include a green light emitting material or a mixture of a green host and a green dopant. The green host may include Alq3, CBP (4,4'-N,N'-dicarbazole-biphenyl), or PVK (poly(n-vinylcarbazole)), like the blue host. A material having an electron transport characteristic may be employed as the green host. An electron transport layer (ETL) to be described later may be omitted in a case where the material having an electron transport characteristic is the green host of the green emission layer 135b and the red host of the red emission layer 135a.

As a green dopant, Ir(ppy)3, Ir(ppy)2(acac), Ir(mpyp)3, or the like may be employed, but is not limited thereto.

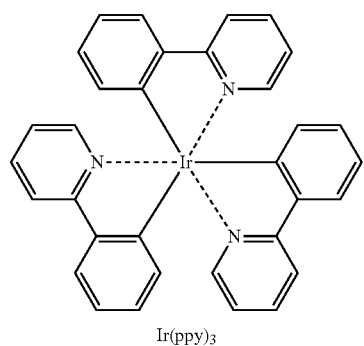

Ir(ppy)₃

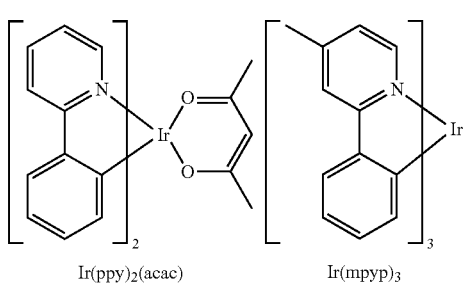

Ir(ppy)₂(acac)   Ir(mpyp)₃

An ETL 140 may be provided on the emission layers 135a, 135b, and 135c. As the ETL 140, a well-known electron transport material may be employed. An example of the electron transport material may include Bphen (4,7-diphenyl-1,10-phenanthroline) or BAlq (bis(2-methyl-8-quinolinolate)-4-(phenylphenolato)aluminum).

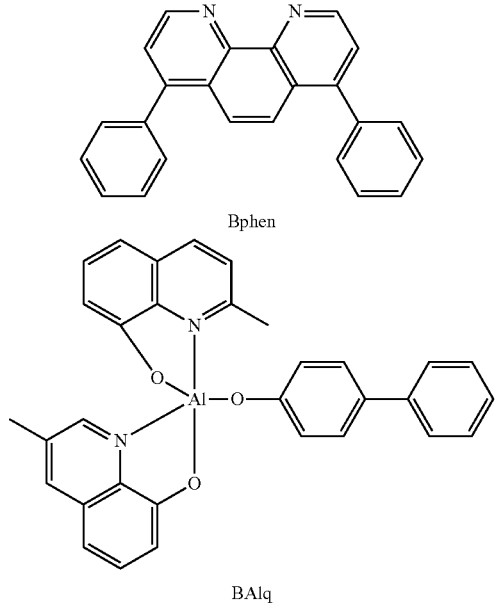

Bphen

BAlq

An electron injection layer (EIL) 150 may be disposed on the ETL 140. The EIL 150 may be formed of, e.g., LiQ, LiF, Li2O, NaCl, NaF, KF, RbF, CsF, or BaO, but is not limited thereto.

The second electrode 270 may be disposed on the EIL 150. The second electrode 270 may be a cathode, and may include at least one of silver (Ag), a silver alloy, aluminum (Al), an aluminum alloy, magnesium (Mg), and a magnesium alloy.

A capping layer 290 may be disposed on the second electrode 270, and the capping layer 290 may serve to protect the OLED display against external moisture or impurities.

By way of summation and review, embodiments provide an organic light emitting diode (OLED) display having an advantage of being capable of reducing incidence of dark points.

In accordance with exemplary embodiments, a high-efficiency OLED display may be provided that is capable of reducing incidence of dark points by forming an HITL layer (a functional layer simultaneously serving to perform a hole injection function and a hole transport function) as a single layer in a blue subpixel unlike other subpixels.

DESCRIPTION OF SYMBOLS

110 substrate
131a, 131b first common layer
132 second common layer
133 auxiliary layer
135a, 135b, 135c emission layer
140 electron transport layer (ETL)
150 electron injection layer (EIL)
191 first electrode
270 second electrode
290 capping layer Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display comprising:
   a substrate including a first subpixel, a second subpixel, and a third subpixel;
   a first electrode on each of the first subpixel, the second subpixel, and the third subpixel;
   a second electrode facing the first electrode;
   a first common layer on the first subpixel and the second subpixel;
   a first emission layer and a second emission layer on the first common layer;
   a second common layer on the third subpixel and directly on the first electrode on the third subpixel; and
   a third emission layer on the second common layer,
   wherein:
      the first common layer includes a first doping layer and a second doping layer on the first doping layer,
      each of the doping layers including a p-type dopant, and
      the second common layer is formed as a single layer.

2. The OLED display as claimed in claim 1, wherein the second common layer includes a p-type dopant.

3. The OLED display as claimed in claim 2, wherein each of the first common layer and the second common layer includes a hole injection material and a hole transport material.

4. The OLED display as claimed in claim 3, wherein the first emission layer is a red emission layer, the second emission layer is a green emission layer, and the third emission layer is a blue emission layer.

5. The OLED display as claimed in claim 3, wherein the first electrode includes at least one of silver (Ag) and indium-tin oxide (ITO).

6. The OLED display as claimed in claim 5, wherein the second electrode includes at least one of silver (Ag), a silver alloy, aluminum (Al), an aluminum alloy, magnesium (Mg), and a magnesium alloy.

7. The OLED display as claimed in claim 1, further comprising:
   a first auxiliary layer between the first common layer and the first emission layer; and
   a second auxiliary layer between the first common layer and the second emission layer.

8. The OLED display as claimed in claim 1, wherein the first doping layer and the second doping layer include the same components.

9. The OLED display as claimed in claim 1, wherein the second common layer is the only layer between the third emission layer and the first electrode on the third subpixel.

10. An organic light emitting diode (OLED) display comprising:
    a substrate including a first subpixel, a second subpixel, and a third subpixel;
    a first electrode on each of the first subpixel, the second subpixel, and the third subpixel;
    a second electrode facing the first electrode;
    a first common layer on the first subpixel and the second subpixel;
    a first emission layer and a second emission layer on the first common layer;
    a second common layer on the third subpixel; and
    a third emission layer on the second common layer,
    wherein:
       the first common layer includes a first doping layer and a second doping layer on the first doping layer,
       each of the doping layers including a p-type dopant,
       the second common layer is formed as a single layer, and
       the second common layer is the only layer between the third emission layer and the first electrode on the third subpixel.

* * * * *